(12) United States Patent
Chuang et al.

(10) Patent No.: US 12,431,214 B2
(45) Date of Patent: Sep. 30, 2025

(54) EXTERNAL MAGNETIC FIELD DETECTION FOR MRAM DEVICE

(71) Applicant: Taiwan Semiconductor Manufacturing Company, Ltd., Hsinchu (TW)

(72) Inventors: Harry-Hak-Lay Chuang, Zhubei (TW); Yuan-Jen Lee, Hsinchu (TW); Tien-Wei Chiang, Taipei (TW); Yi-Chun Shih, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 68 days.

(21) Appl. No.: 17/724,963

(22) Filed: Apr. 20, 2022

(65) Prior Publication Data

US 2023/0207045 A1    Jun. 29, 2023

Related U.S. Application Data

(60) Provisional application No. 63/294,527, filed on Dec. 29, 2021.

(51) Int. Cl.
*G11C 29/52* (2006.01)
*G06F 11/10* (2006.01)
(Continued)

(52) U.S. Cl.
CPC .......... *G11C 29/52* (2013.01); *G06F 11/1044* (2013.01); *G11C 11/161* (2013.01);
(Continued)

(58) Field of Classification Search
CPC ... G11C 29/52; G11C 11/161; G11C 11/1673; G11C 11/1675; G11C 11/1677;
(Continued)

(56) References Cited

U.S. PATENT DOCUMENTS 7,286,429 B1 * 10/2007 Liaw ................ G11C 13/0004
                                                   365/158
7,532,203 B2    5/2009 Sharma
(Continued)

FOREIGN PATENT DOCUMENTS

JP    2004303382 A    10/2004
JP    2006527447 A    11/2006
WO    2007040167 A1    4/2007

OTHER PUBLICATIONS

Wang et al. "Impact of external magnetic field on embedded perpendicular STT-MRAM technology qualified for solder reflow" 2017 IEEE International Electron Devices Meeting (IEDM), published on Jan. 25, 2018.
(Continued)

*Primary Examiner* — James C Kerveros
(74) *Attorney, Agent, or Firm* — Eschweiler & Potashnik, LLC (57) ABSTRACT

A magnetoresistive random access memory (MRAM) device is provided. The MRAM device includes a main magnetic tunnel junction (MTJ) array comprising a plurality of memory cells configured to store memory data and a reference MTJ array comprising a plurality of reference cells having MTJ structures. The MRAM device further includes a controller operatively associated with the main MTJ array and the reference MTJ array. The controller is configured to receive a gross resistance of the reference MTJ array being related to a strength of an external magnetic field, determine whether the external magnetic field is fatal based on the received gross resistance of the reference MTJ array and a pre-determined threshold, and provide notification indicating that the memory data stored in the main MTJ array is untrustworthy if it is determined that the external magnetic field around the MRAM device is fatal.

20 Claims, 6 Drawing Sheets

(51) Int. Cl.
 *G11C 11/16* (2006.01)
 *H10B 61/00* (2023.01)
(52) U.S. Cl.
 CPC ...... *G11C 11/1673* (2013.01); *G11C 11/1675* (2013.01); *G11C 11/1677* (2013.01); *H10B 61/22* (2023.02)
(58) Field of Classification Search
 CPC ........ G11C 2029/0409; G11C 11/1695; G11C 29/42; G11C 2029/0411; G11C 2029/4402; G11C 29/44; G06F 11/1044; G06F 11/1008; G06F 11/1048; H10B 61/22
 USPC .......................................................... 714/718
 See application file for complete search history.

(56) References Cited

U.S. PATENT DOCUMENTS

| | | | | |
|---|---|---|---|---|
| 8,057,925 | B2* | 11/2011 | Horng | H10N 50/85 365/158 |
| 9,368,179 | B2 | 6/2016 | Katti et al. | |
| 10,777,734 | B2 | 9/2020 | Liu et al. | |
| 10,877,089 | B2 | 12/2020 | Chuang et al. | |
| 2008/0205110 | A1* | 8/2008 | Boeve | G01R 33/098 324/252 |
| 2008/0279027 | A1* | 11/2008 | Boeve | G11C 16/3431 365/210.1 |
| 2009/0122597 | A1* | 5/2009 | Sugibayashi | G11C 11/1655 365/158 |
| 2009/0194832 | A1* | 8/2009 | Li | G11C 11/1653 257/E29.323 |
| 2009/0273967 | A1* | 11/2009 | Schroegmeier | G11C 11/1673 365/158 |
| 2014/0043892 | A1* | 2/2014 | Lee | G11C 11/16 365/158 |
| 2016/0093352 | A1* | 3/2016 | Jung | G11C 29/021 365/158 |
| 2016/0104519 | A1* | 4/2016 | Slaughter | G11C 11/1659 365/158 |
| 2019/0140020 | A1 | 5/2019 | Ying et al. | |

OTHER PUBLICATIONS

Gallagher et al. "22nm STT-MRAM for Reflow and Automotive Uses with High Yield, Reliability, and Magnetic Immunity and with Performance and Shielding Options" 2019 IEEE International Electron Devices Meeting (IEDM), published on Feb. 13, 2020.

* cited by examiner

EXTERNAL MAGNETIC FIELD DETECTION FOR MRAM DEVICE

REFERENCED TO RELATED APPLICATION

This application claims the benefit of U.S. Provisional Application No. 63/294,527, filed on Dec. 29, 2021, the contents of which are hereby incorporated by reference in their entirety.

BACKGROUND

Many modern-day electronic devices include electronic memory. Electronic memory may be volatile memory or non-volatile memory (NVM). Non-volatile memory is able to store data in the absence of power, whereas volatile memory is not. Magnetoresistive random-access memory (MRAM) is a promising candidate for next generation non-volatile memory technology due to relative simple and compact structures and its compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random-access memory (MRAM) device is a promising candidate for next generation non-volatile memory technology due to relative simple and compact structures and its compatibility with complementary metal-oxide-semiconductor (CMOS) logic fabrication processes. However, one drawback of the MRAM device is that the data status stored in the MRAM device may be impacted by a strong external magnetic field. The external magnetic field could not only affect retention and write window of the MRAM device, but also induce undesired state flipping of the stored digital data, which may cause the data loss or being tampered. One current approach to detect and/or address the effect of the external magnetic field to a MRAM device is to have a sensor, such as a Hall sensor, to detect the strength of the external magnetic field near the MRAM device. However, a significant additional space is needed to accommodate the Hall sensor or similar. The Hall sensor placed separately from the MRAM device occupies a large area and is difficult to be integrated to the MRAM device.

In view of the above, the present disclosure relates to methods to perform external magnetic field detection and data protection for a MRAM device and associated apparatuses. In some embodiments, a strength of an external magnetic field around the MRAM device is determined by processing measurement data of the MRAM device without involving a separate direct measurement of the external magnetic field. In some embodiments, an existing function of a controller, such as an error correction code (ECC) processing of memory data read from the MRAM device is used to derive the strength of the external magnetic field. For example, error correction redundancy (redundant bits) corresponding to the memory data is obtained through the ECC processing and indicates a failure rate of data retention, which is positively correlated to and thus indicates the strength of the external magnetic field around the MRAM device. In some embodiments, the failure rate is compared to a pre-determined failure rate threshold. A notification signal is then determined based on the comparison result and provided to indicate the strength of the external magnetic field.

In some further embodiments, a reference magnetic tunnel junction (MTJ) array is integrated into the MRAM device and used to detect the strength of the external magnetic field around the MRAM device in addition to a main MTJ array used for writing, storing, and reading memory data of the MRAM device. In some aspects, the MTJ cells of the reference MTJ array are pre-set to one resistance state may be flipped to an opposite resistance state subject to the external magnetic field. Thus, the resistance change of the reference MTJ array can be used to indicate the strength of the external magnetic field. By integrating the reference MTJ array with the MRAM device on the same substrate, no significant extra space is needed compared to using a separate stand-alone magnetic sensor, and fabrication process is not complicated since the reference MTJ array can be formed together with the main MTJ array.

Figure 1:
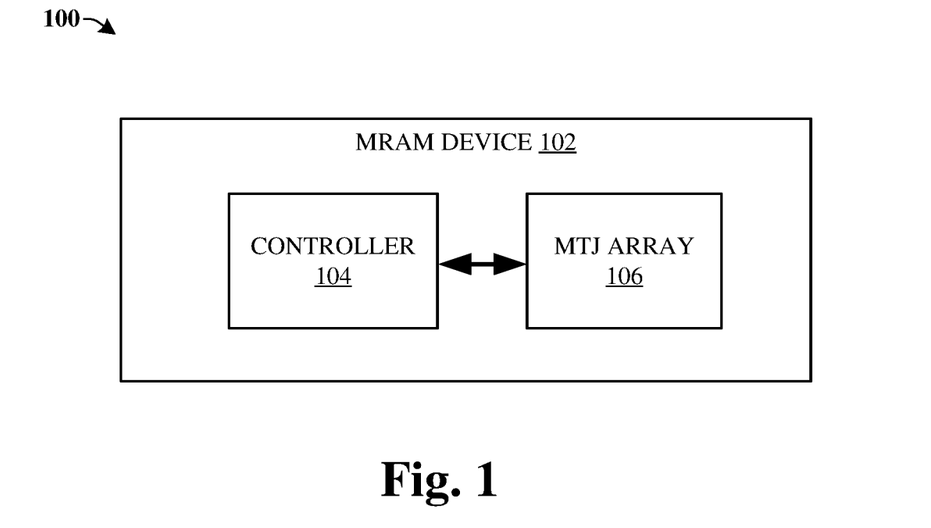
FIG. 1 illustrates a block diagram showing a MRAM device configured to detect an external magnetic field by processing data read from an MTJ array in accordance with some embodiments.

FIG. 1 illustrates a block diagram 100 showing a MRAM device 102 configured to detect an external magnetic field by processing memory data read from an MTJ array 106 in accordance with some embodiments. The memory data may be written, read, and processed by a controller 104 operatively coupled to the MTJ array 106. In some embodiments, the MTJ array 106 and the controller 104 are integrated in one chip, while in some alternative embodiments, the MTJ array 106 and the controller 104 are arranged on separate chips and operatively coupled from one another through various wire or wireless signal transfer buses such as conductor tracks, optical fibers, wirelessly or as another signal transmission medium.

In some embodiments, the MTJ array 106 comprises a plurality of MTJ cells respectively composed of two magnetic layers separated by a tunneling barrier layer. One of the magnetic layers has a free magnetization that can be switched between two stable directions, while the other layer has a fixed magnetization direction that acts as a reference layer. For MTJ cells with positive tunnelling magnetoresistance (TMR), if the magnetization directions of the reference layer and free layer are in a parallel orientation, it is more likely that electrons will tunnel through the tunnel barrier layer, such that the MTJ is in a low-resistance state. Conversely, if the magnetization directions of the reference layer and free layer are in an anti-parallel orientation, it is less likely that electrons will tunnel through the tunnel barrier layer, such that the MTJ is in a high-resistance state. Consequently, the MTJ can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). It is noted that MTJ cells can also have a negative TMR, e.g., lower resistance for anti-parallel orientation and higher resistance for parallel orientation. Because of their binary nature, MTJ cells are used to store digital data, with the low resistance state $R_P$ corresponding to a first digital data state (e.g., logical "0"), and the high-resistance state $R_{AP}$ corresponding to a second digital data state (e.g., logical "1").

When digital data is stored in the MRAM device 102, error correction code (ECC) can be used for better data reliability assurance. An error correction code (ECC) block can be implemented to correct errors in the digital data. As an example, the ECC block can be a number of additional bits encoded following data bits from the original data, instruction, variable or message during a write/programming operation. The ECC block can be encoded by various error correction algorithms, such as single-error-correcting (SEC) Hamming code, single-error-correcting-double-error-detecting (SEC-DED) modified Hamming, and SEC-DED Hsiao code. For example, memory content of the MTJ array 106 may include a block of k data bits that can be encoded by an error correction algorithm to generate a block of m check bits as the ECC block, where m, k are positive integrals. As time goes by, memory content of the MTJ array 106 may suffer data degradation. When the original message is reconstructed, the ECC block can be decoded to check and correct certain numbers of the error bits. In some examples, the m check bits can correct a correction number of bit errors and/or detect a detection number of bit errors. The detection number of bit errors can be greater than the correction number of bit errors.

When a strong external magnetic field is presented, the memory content of the MTJ array 106 may suffer disturbance or attack by and be converted to contain additional error bits. If a number or scale of the error bits increases but is still within the repairable range, the error correction code can be used to correct those error bits. If the number or scale of the error bits is out of the repairable range and/or the error correction code is also altered and becomes unusable, the memory content would suffer unrepairable damage. For either case, running check of the number or scale of the error bits and condition of the error correction procedure is indicative as to the effects of the external magnetic field. In some embodiments, when the number or scale of the error bits exceeds a pre-determined threshold, the controller 104 or other components of the MRAM device 102 may detect and inform users that such event has occurred. A further action may also be taken according to the acquired number or scale of the error bits, such as wiping out the memory data for security purpose and/or rewriting the memory data.

Figure 2:
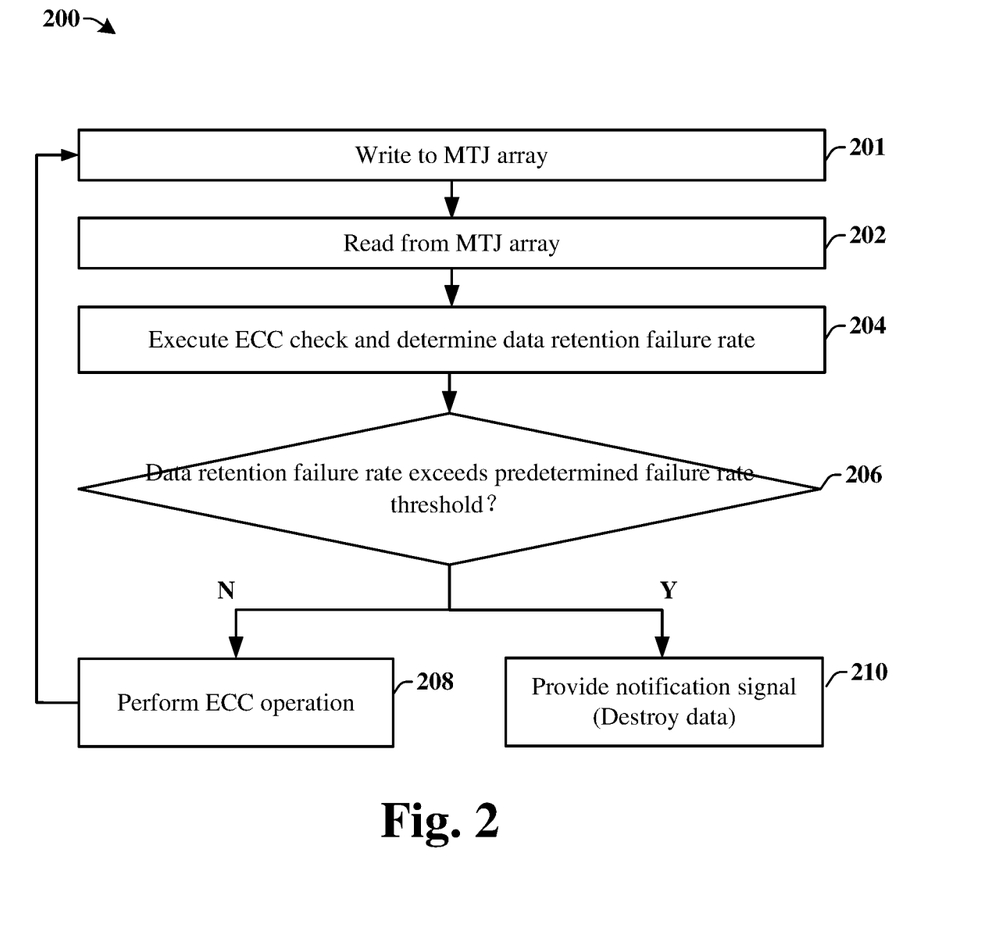
FIG. 2 illustrates a flow diagram showing a method for detecting an external magnetic field for a MRAM device by processing data read from an MTJ array in accordance with some embodiments.

FIG. 2 illustrates a flow diagram 200 showing a method for detecting an external magnetic field for a MRAM device by processing data read from an MTJ array in accordance with some embodiments. The method can be stored in an electronic medium and executed by a computer related device such as the MTJ array 106 and the controller 104 of the MRAM device 102 as shown and described above associated with FIG. 1.

As shown by act 201, in some embodiments, memory data is written and stored in the MTJ array. The memory data may comprise bits of original data, instruction, variable or message. Error correction redundancy bits (ECC bits) are generated based on the memory data. The ECC bits can be encoded by various error correction algorithms before writing the memory data to the MTJ array. The error correction algorithms can be any suitable algorithms such as single-error-correcting (SEC) Hamming code, single-error-correcting-double-error-detecting (SEC-DED) modified Hamming, and SEC-DED Hsiao code. The ECC bits may be written and stored in the MTJ array together with memory data and may also be stored separately outside the MTJ array.

At act 202, in some embodiments, the memory data is read from the MTJ array. The ECC bits may be read together with the memory data including a number N of additional bits (e.g., N=1, 2, 3 . . . ) encoded before, after, or within every bit sequence of the memory data. The ECC bits may also include additional ECC bits stored in another memory separated from the MTJ array such as a set of secured or hashed bits for security verification.

At act 204, in some embodiments, an ECC check is executed based on the memory data and the ECC bits, and a bit error rate is determined from the ECC check. For example, the ECC bits can be decoded to detect a number or scale of the error bits such as the bit error rate (BER) and use the detect data to determine a data retention failure rate. For example, the bit error rate may be proximately considered as a data retention failure rate of the MRAM device. As another example, the data retention failure rate may be calculated based on the bit error rate or the detected number or scale of the error bits by deducting an average writing/reading error rate or counting other factors.

At act 206, in some embodiments, the data retention failure rate is compared with a pre-determined failure rate threshold. The failure rate threshold may be pre-set in specification. The failure rate threshold may be determined by retrieving and/or obtaining a pre-stored value from a memory. In some embodiments, the failure rate threshold may be pre-determined based on a coverage of the ECC block, such as 60% to 80% of the coverage of ECC block. For example, the failure rate threshold can be set to 6 to 8 ppm (0.0006%-0.0008%) when the ECC block can cover 10 ppm. Additionally or alternatively, the failure rate threshold may be determined based on a result of a test. An external magnetic field that fatally affects the MRAM device may be supplied as a threshold strength of the external magnetic field to determine the failure rate threshold that the MRAM device cannot withstand. The test may be performed independently from the fabrication and/or the operation of the MRAM device.

Additionally or alternatively, the ECC check may indicate a condition of the error correction procedure such as whether the number or scale of the error bits is still within the repairable range, is out of the repairable range, and/or the error correction code is altered and becomes unusable. For the latter two situations where the number or scale of the error bits is out of the repairable range and/or altered and becomes unusable, the memory content would suffer unrepairable damage. The repairable range may be equivalent to the coverage of the ECC block in some instances.

At act 208, in some embodiments, if the data retention failure rate is smaller than, or no greater than, the failure rate threshold as determined by act 206, an error correction operation can be performed to correct the error bits. For example, the ECC bits can be decoded to correct a number of the error bits. The MTJ array may also be partially or fully rewritten with the corrected bits of the memory data.

At act 210, in some embodiments, a notification signal is provided if the data retention failure rate is greater, or no smaller, than the failure rate threshold as determined by act 204. The data retention failure rate exceeding the failure rate threshold may indicate a strong external magnetic field around the MRAM device, and that the stored memory data is untrustworthy. A further action may follow upon receiving the notification signal, such as wiping out the memory data stored in the MTJ array and/or reload or request a refreshed data to be rewritten to the MTJ array. In some further aspects, a destroy command may be given in order to protect security data. Since the existing ECC processing is utilized, no additional hardware is required to detect the strength of the magnetic field around the MRAM.

Figure 3:
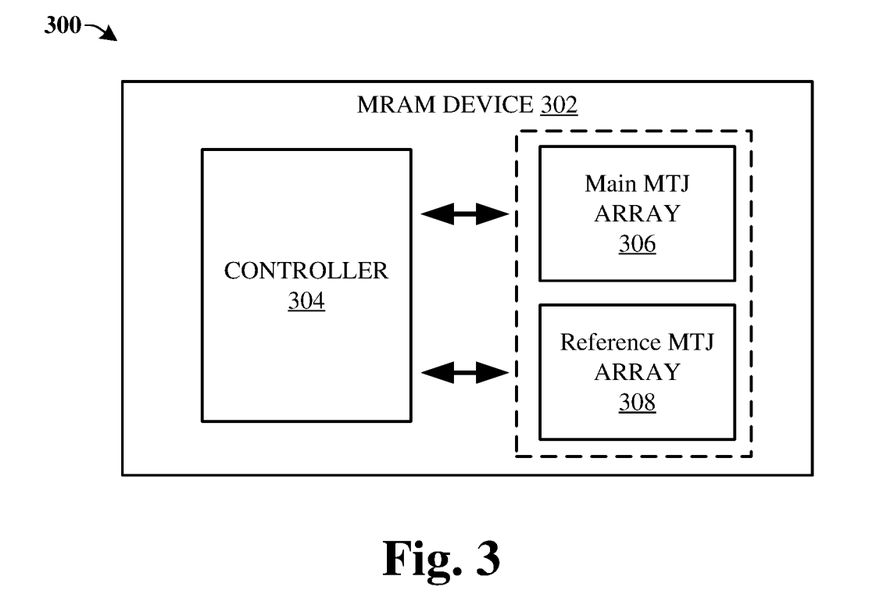
FIG. 3 illustrates a block diagram showing a MRAM device configured to detect an external magnetic field by processing data read from a reference MTJ array in accordance with some additional embodiments.

FIG. 3 illustrates a block diagram showing a MRAM device 302 configured to detect an external magnetic field by processing data read from a reference MTJ array 308 in accordance with some additional embodiments. The memory data may be written, read, and processed by a controller 304 operatively coupled to a main MTJ array 306 and the reference MTJ array 308. In some embodiments, the main MTJ array 306, the reference MTJ array 308, and the controller 304 are integrated in one chip, while in some alternative embodiments, the main MTJ array 306 and the reference MTJ array 308 can be arranged on a separate chip from the controller 304 and operatively coupled from one another through various wire or wireless signal transfer buses such as conductor tracks, optical fibers, wirelessly or as another signal transmission medium.

The MRAM device 302, the controller 304, and the main MTJ array 306 may share common features with the MRAM device 102, the controller 104, and the MTJ array 106 as described above. Additionally or alternatively, in some embodiments, the MRAM device 302 further comprises the reference MTJ array 308 that is configured to detect and indicate the strength of the external magnetic field around the MRAM device 302. The reference MTJ array 308 may comprise a plurality of reference MTJ cells. In some aspects, the reference MTJ cells are pre-set to one resistance state. The reference MTJ cells may be flipped to an opposite resistance state subject to the external magnetic field, and more reference MTJ cells are flipped under a stronger external magnetic field. Thus, a gross resistance of the reference MTJ array 308 is detected and used to indicate a strength of the external magnetic field. In some other aspects, another reference MTJ array signal is detected and used to indicate a strength of the external magnetic field. More details of the reference MTJ array 308 and its operations are described below associated with FIG. 5A.

Figure 4:
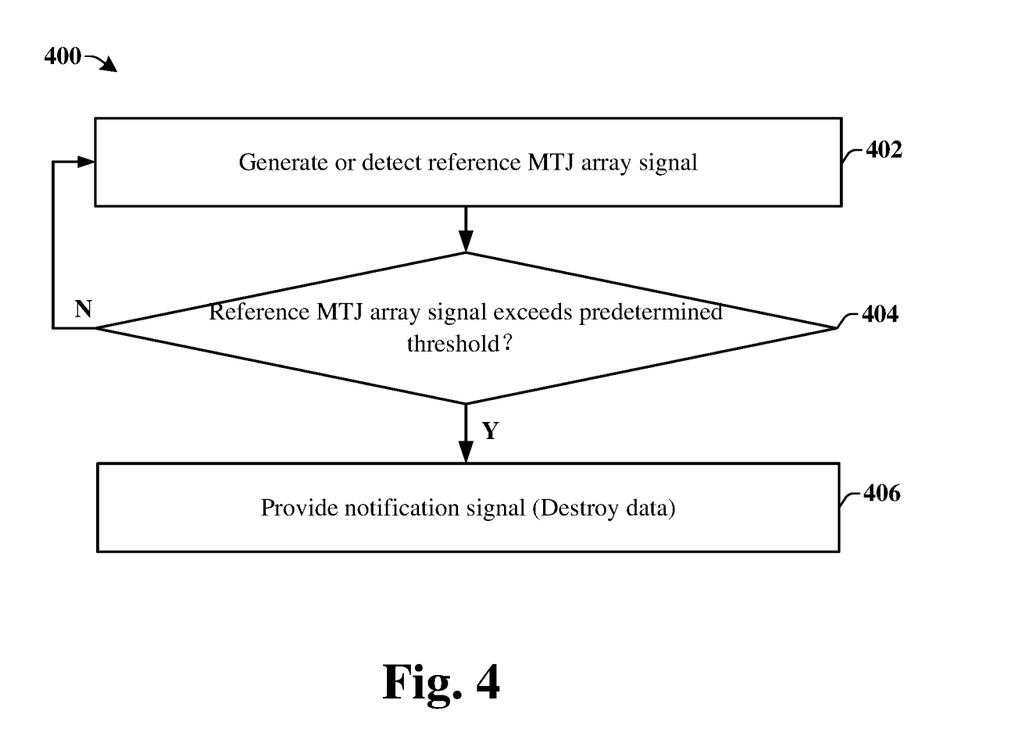
FIG. 4 illustrates a flow diagram showing a method for detecting an external magnetic field for a MRAM device by processing data read from a reference MTJ array in accordance with some additional embodiments.

FIG. 4 illustrates a flow diagram 400 showing a method for detecting an external magnetic field for a MRAM device by processing data read from a reference MTJ array in accordance with some additional embodiments. The method can be stored in an electronic medium and executed by a computer related device such as the main MTJ array 306 and the controller 304 of the MRAM device 302 as shown and described above associated with FIG. 3.

At act 402, in some embodiments, a reference MTJ array signal is read or detected from the reference MTJ array. In some embodiments, the plurality of reference MTJ cells includes MTJs connected in series, in parallel, or in a combination of series and parallel connection. In some embodiments, the reference MTJ array signal is a gross resistance of the reference MTJ array.

At act 404, in some embodiments, the reference MTJ array signal is processed and compared with a pre-determined threshold. The reference MTJ array signal is positively related to and thus indicates a strength of the external magnetic field around the MRAM device. In some aspects, the reference MTJ array signal is a gross resistance of the reference MTJ array 308 indicating an amount of MTJ cells that flip under an external magnetic field and is used to indicate a strength of the external magnetic field. In some aspects, a resistance change of the reference MTJ array is detected. The resistance change is related to and thus used to indicate the strength of the external magnetic field. In some other aspects, a resistance threshold may be used to be compared with the gross resistance of the reference MTJ array 308. The resistance threshold may be pre-set in specification and can be based on application needs. The resistance threshold may be retrieved from a memory. During operation, data processing is performed for the main MTJ array 306. A resistance of the reference MTJ array 308 may be initialized by setting the plurality of MTJ cells of the reference MTJ array 308 to a first state. If an external magnetic field is presented, a resistance of the reference MTJ array 308 may be changed, and the resistance change is related to a strength of the external magnetic field.

In some other aspects, the reference MTJ array signal can be other parameters of the reference MTJ array 308. For example, the reference MTJ array signal can be a failure rate that is compared to a pre-determined failure rate threshold, similar as discussed above associated with FIG. 2.

The MRAM device can continue to operate if the reference MTJ array signal is smaller, or no greater than the pre-determined threshold. The reference MTJ array signal can also be checked again, for example, periodically or upon request if the reference MTJ array signal is smaller, or no greater than the pre-determined threshold.

At act 406, in some embodiments, a notification signal is provided if the reference MTJ array signal is greater, or no smaller than the pre-determined threshold. The notification signal may indicate that the stored memory data is untrustworthy. In some embodiments, a further action follows upon receiving the notification signal, such as wiping out the memory data stored in the main MTJ array 306 and/or reload or request a refreshed data to be rewritten to the main MTJ array 306. In some further aspects, a destroy command may be given to destroy data in order to protect the security of data. In some further embodiments, an initializing bias can be applied to the reference MTJ array 308 to pre-set or reset the reference cells 108' for a next detection of the external magnetic field. Since the reference MTJ array 308 can be formed together with the main MTJ array 306, the fabrication process is not complicated compared to forming a magnetic sensor of a different kind.

Figure 5A:
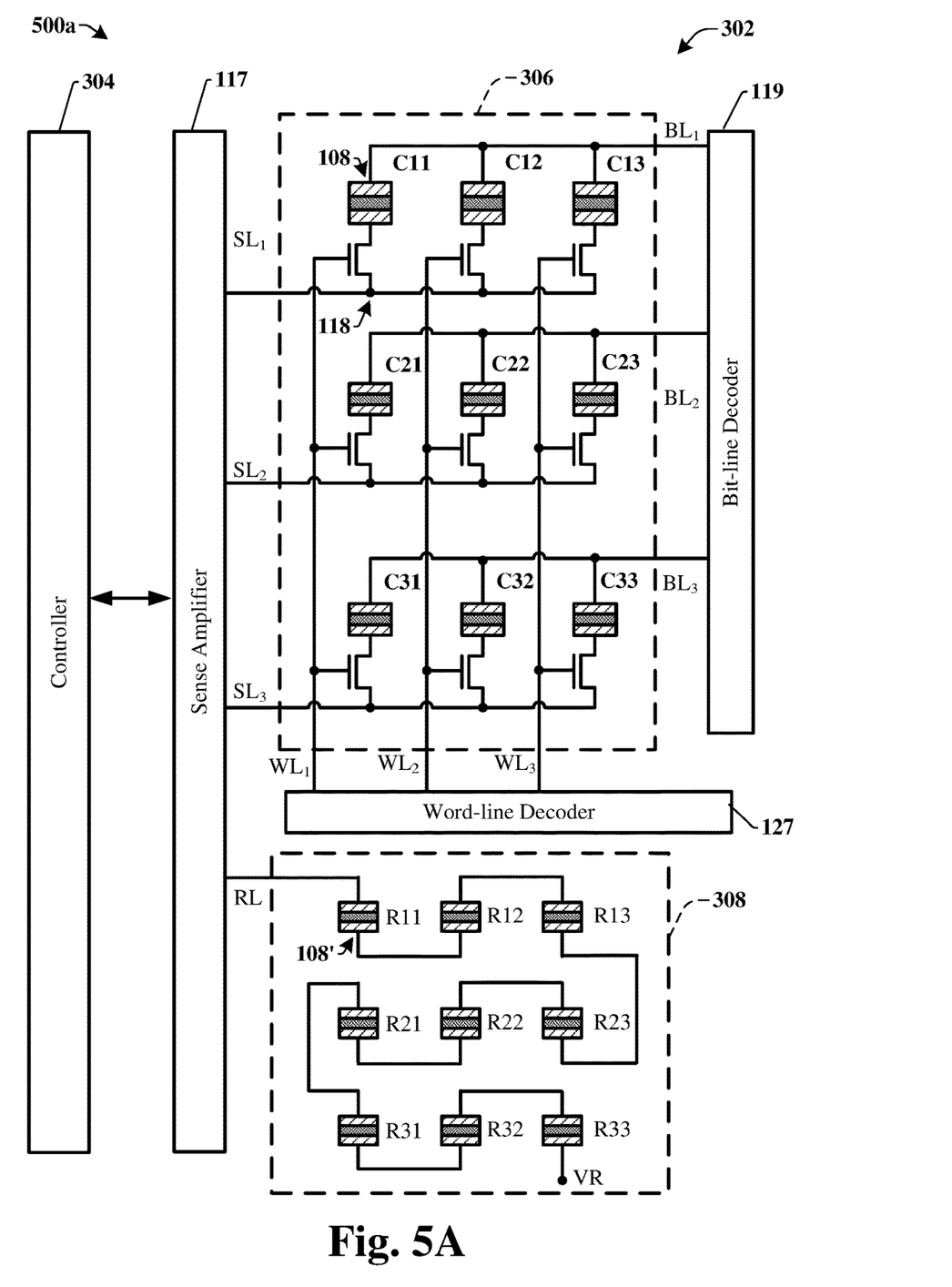
FIG. 5A illustrates a block diagram showing a MRAM device configured to detect an external magnetic field by processing data from a reference MTJ array in accordance with some additional embodiments.

FIG. 5A illustrates a block diagram 500a showing circuit diagrams of the MRAM device 302 of FIG. 3 configured to detect an external magnetic field using the reference MTJ array 308 in accordance with some embodiments. Though the circuit diagram shown in FIG. 5A can be used to perform functions as described above associated with FIGS. 1-4. Alternatively, the MRAM device shown in FIG. 5A can perform other functions with magnetic components that subject to effect of an external magnetic field.

In some embodiments, the main MTJ array 306 comprises a plurality of memory units C11-C33. The memory units C11-C33 may be arranged within the main MTJ array 306 in rows and/or columns. The main MTJ array 306 may have any number of memory units though illustrated as having 3 rows and 3 columns in FIG. 5A. One memory unit of the memory units C11-C33 may include a memory cell 108 coupled to a selector 118. The selector 118 is configured to selectively provide access to the memory cell 108 selected while inhibiting leakage currents through non-selected memory units.

The memory units C11-C33 may be controlled through bit-lines $BL_1$-$BL_3$, word-lines $WL_1$-$WL_3$, and source lines $SL_1$-$SL_3$. The word-lines $WL_1$-$WL_3$ may be used to operate the selectors 118 corresponding to the memory units C11-C33. When a selector 118 for a memory cell 108 is turned on, a voltage may be applied to that memory cell. A bit line decoder 119 applies a read voltage or a write voltage to one of the bit-lines $BL_1$-$BL_3$. A word line decoder 127 applies another voltage to one of the word-lines $WL_1$-$WL_3$, which turns on the selector 118 for the memory units C11-C33 in a corresponding row. Together, these operations cause the read voltage or the write voltage to be applied to a selected memory unit among the memory units C11-C33.

Appling a voltage to a selected memory cell 108 results in a current. During read operations, a sense amplifier 117 determines the programming state of the selected memory cell based on the current. The sense amplifier 117 may be connected to source lines $SL_1$-$SL_3$. Alternatively or additionally, the sense amplifier 117 may be connected to bit-lines $BL_1$-$BL_3$. The sense amplifier 117 may determine the programming state of the memory cell 108 based on the current. In some embodiments, the sense amplifier 117 determines the programming state of the memory cell 108 by comparing the current to one or more reference currents. The sense amplifier 117 may convey the programming state determination to an I/O buffer, which may be coupled to a driver circuit to implement write and write verify operations. The driver circuit is configured to select a voltage to apply to selected memory unit for read, write, and write-verify operations.

In some embodiments, the reference MTJ array 308 comprises a plurality of magnetic reference cells R11-R33. The magnetic reference cells R11-R33 may be arranged within the reference MTJ array 308 in rows and/or columns or in any other suitable patterns. The reference MTJ array 308 may have any amount of reference cells 108'. The amount of the reference cells 108' of reference MTJ array 308 relates to a resolution of the external magnetic field detection. In some aspects, the reference MTJ array 308 may have at least 1/r of reference cells 108', where r is a failure rate that can be listed in the specification. For example, the reference MTJ array 308 may have at least $10^6$ reference cells 108', which can produce a $10^6$ resolution corresponding to a 1 ppm failure rate (1E-6 bit error rate). In some aspects, the reference cells 108' are pre-set to one resistance state and may be flipped to an opposite resistance state subject to the external magnetic field.

Figure 5B:
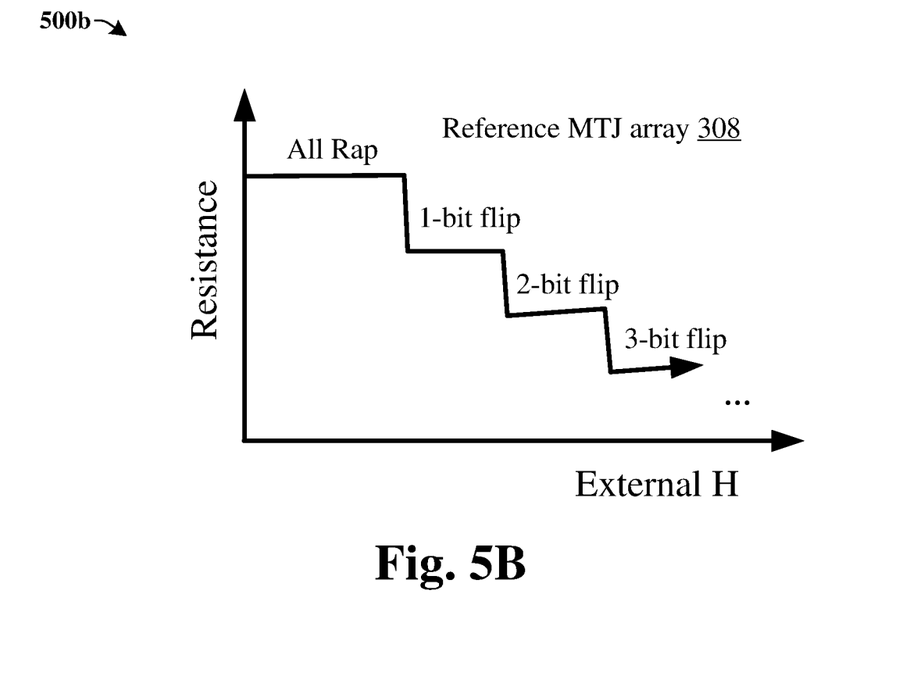
FIG. 5B shows an example plot of a resistance of a reference MTJ array in response to a strength of an external magnetic field around a MRAM device in accordance with some embodiments.

FIG. 5B shows an example plot 500b of a resistance of the reference MTJ array 308 in response to an external magnetic field H around the MRAM device 302 (see FIG. 5A) in accordance with some embodiments. In some embodiments, all of the reference cells 108' of the reference MTJ array 308 may be initially pre-set to the high resistance state (Rap) and may be capable of being pre-set to the high resistance state (Rap). More reference cells 108' are flipped under a stronger external magnetic field. A gross resistance of the reference MTJ array 308 decreases with an increasing number of reference cells 108' changed to a flipped resistance state, and therefore decreases with an increasing strength of the external magnetic field H around the MRAM device 302. Alternatively, all of the reference cells 108' of the reference MTJ array 308 may be initially pre-set to the low resistance state (Rp) and may be capable of being pre-set to the low resistance state (Rp). The gross resistance of the reference MTJ array 308 then increases with the increasing number of the reference cells 108' changed to a flipped resistance state, and therefore increases with the increasing strength of the external magnetic field H around the MRAM device 302. Thus, the resistance change of the reference MTJ array 308 can be used to indicate the strength of the external magnetic field H. By integrating the reference MTJ array 308 with the MRAM device 302, no significant extra space is needed compared to using a separate magnetic sensor, and fabrication process is not complicated since the reference MTJ array 308 can be formed together with the main MTJ array 306.

Figure 5C:
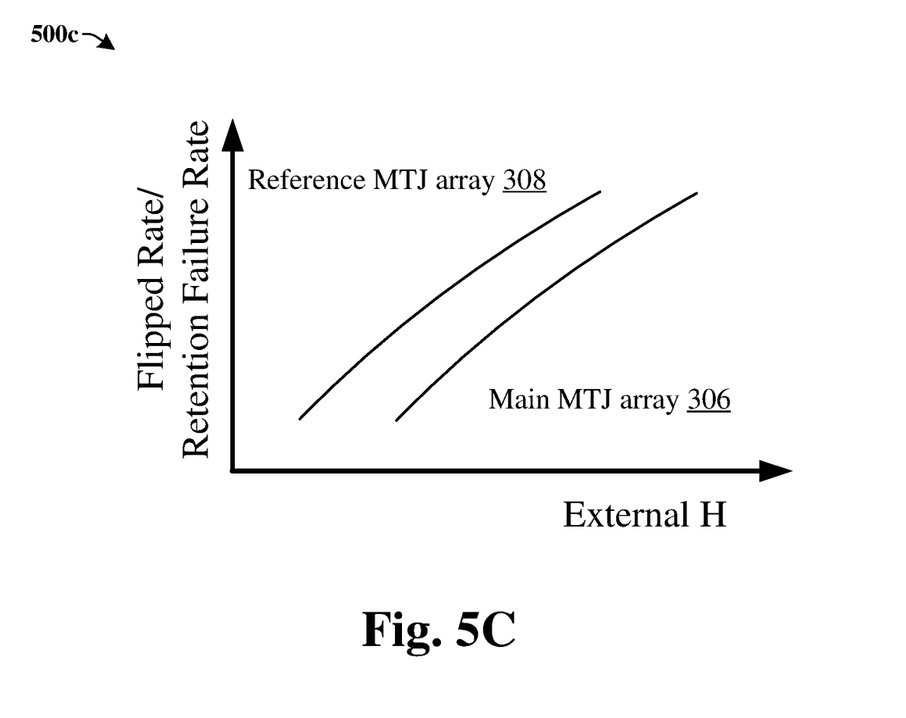
FIG. 5C shows an example plot of a retention failure rate of a main MTJ array and a state flipping rate of a reference MTJ array 308 in response to a strength of an external magnetic field around a MRAM device in accordance with some embodiments.

FIG. 5C shows an example plot 500c of a retention failure rate of the main MTJ array 306 and a state flipping rate of the reference MTJ array 308 in response to an external magnetic field H around the MRAM device 302 (see FIG. 5A) in accordance with some embodiments. The retention failure rate of the main MTJ array 306 increases with an increasing strength of the external magnetic field H around the MRAM device 302. The state flipping rate of the reference MTJ array 308 also increases with the increasing strength of the external magnetic field H around the MRAM device 302. In some aspects, the reference MTJ array 308 is more sensitive to the external magnetic field H than the main MTJ array 306 and thus better suits to detect the external magnetic field H. In some embodiments, the reference cells 108' have MTJ units of the same or similar compositions as the memory cells 108 but with lateral dimensions smaller than those of the memory cells 108. More details of the memory cells 108 and the reference cells 108' are also described associated with FIG. 6 and FIG. 7 below.

Figure 6:
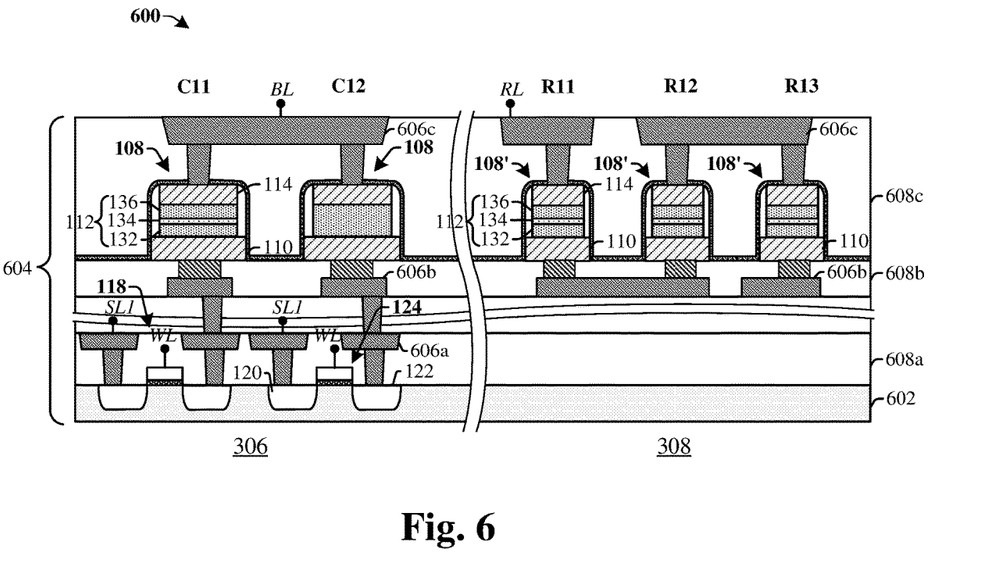
FIG. 6 illustrates a cross-sectional view showing a MRAM device configured to detect an external magnetic field by processing data read from a reference MTJ array in accordance with some embodiments.
Figure 7:
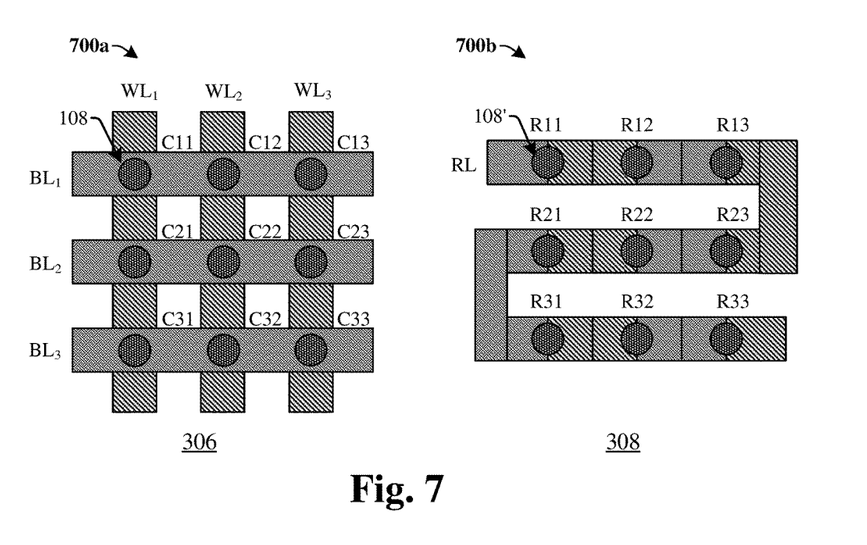
FIG. 7 illustrates top views showing a MRAM device configured to detect an external magnetic field by processing data read from a reference MTJ array.

FIG. 6 and FIG. 7 show some further device structure examples for the MRAM device 302 as disclosed associated with FIGS. 3-5 above. FIG. 6 illustrates a cross-sectional view 600 showing the main MTJ array 306 comprised of representative memory units C11, C12 and the reference MTJ array 308 comprised of magnetic reference cells R11, R12, R13. An interconnect structure 604 is disposed over a substrate 602. The interconnect structure 604 comprises stacked interconnect metal layers 606a, 606b, 606c as examples disposed within stacked inter-level dielectric (ILD) layers 608a, 608b, 608c as examples. The stacked interconnect metal layers 606a, 606b, 606c may each comprise one or more layers of interconnect metal lines. The stacked ILD layers 608a, 608b, 608c may each comprise one or more dielectric layer. The memory units C11, C12 respectively comprises the memory cell 108 disposed within the interconnect structure 604. The magnetic reference cells R11, R12, R13 respectively comprises the reference cell 108' also disposed within the interconnect structure 604. In some embodiments, the memory cell 108 and the reference cell 108' may have the same composition.

As an example, the memory cell 108 and the reference cell 108' may respectively comprise a MTJ structure including a bottom electrode 110, a data storage structure 112 arranged over the bottom electrode 110, and a top electrode 114 arranged over the data storage structure 112. An upper interconnect metal layer 606c extends through an upper ILD layer 608c to reach on the top electrode 114. In some embodiments, the bottom electrode 110 and the top electrode 114 may comprise tantalum nitride, titanium nitride, tantalum, titanium, platinum, nickel, hafnium, zirconium, ruthenium, iridium, or the like. In some embodiments, the data storage structure 112 is a magnetic tunnel junction (MTJ), a spin-valve, or other data storage structure containing a magnetic material. Other structures for the data storage structure 112 and/or other memory-cell types for the memory cell 108 and the reference cell 108' are also amenable.

In some embodiments, the data storage structure 112 comprises a reference ferromagnetic element 132 and a free ferromagnetic element 136 stacked and separated by a tunneling barrier element 134. The reference ferromagnetic element 132 has a fixed magnetization direction, whereas the free ferromagnetic element 136 has a variable magnetization that can be switched between two stable directions. In some embodiments, the reference ferromagnetic element 132 is or comprises cobalt iron (e.g., CoFe), cobalt iron boron (e.g., CoFeB), or some other suitable ferromagnetic material(s), or any combination of the foregoing. In some embodiments, the reference ferromagnetic element 132 adjoins an antiferromagnetic element (not shown) and/or is part of or otherwise adjoins a synthetic antiferromagnetic (SAF) element (not shown). In some embodiments, the free ferromagnetic element 136 is or comprises cobalt iron (e.g., CoFe), cobalt iron boron (e.g., CoFeB), or some other suitable ferromagnetic material(s), or any combination of the foregoing. In some embodiments, the tunneling barrier element 134 is a tunnel barrier selectively allowing quantum mechanical tunneling of electrons through the tunneling barrier element 134. The tunneling barrier element 134 may, for example, be or comprise an amorphous barrier, a crystalline barrier, or some other suitable barrier such as aluminum oxide ($AlO_x$), titanium oxide ($TiO_x$), manganese oxide (MgO), spinel ($MgAl_2O_4$), or some other suitable barrier material. Although this disclosure is described largely in terms of MTJs, it is also to be appreciated that it is applicable to spin valve memory elements, which may use a magnetically soft layer as the free ferromagnetic element 136, and a magnetically hard layer as the reference ferromagnetic element 132, and a non-magnetic barrier separating the magnetically hard layer and magnetically soft layer.

The data storage structure 112 has a low resistance or a high resistance depending upon whether magnetizations of the reference ferromagnetic element 132 and the free ferromagnetic element 136 are parallel or anti-parallel. For example, the data storage structure 112 may have the low resistance when the magnetizations of the reference ferromagnetic element 132 and free ferromagnetic element 136 are parallel and may have the high resistance when the magnetizations are antiparallel. During operation, the memory cell 108 can be written, read, and used to store digital data, with the low resistance state corresponding to a first digital data state (e.g., logical "0"), and the high-resistance state corresponding to a second digital data state (e.g., logical "1"), for example. The reference cell 108' can be used to indicate the strength of an external magnetic field, with the flipping status of the low resistance state and the high-resistance state of the reference cell 108' resulting a change of the gross resistance of the reference MTJ array 308.

In some embodiments, the selector 118 is electrically coupled to the bottom electrode 110 of the memory cell 108 through interconnect metal layers 606a, 606b and used to control access of the memory cells 108 in the main MTJ array 306. The interconnect metal layers 606a, 606b may comprise layers of metal lines connected by metal vias disposed between the metal lines. The bottom electrode 110 may be directly connected to a lower metal line or connected through a bottom electrode via. The top electrode 114 may be directly connected to an upper metal line or connected through a top electrode via. A bit line BL may be connected to the top electrode 114. The selector 118 may comprise a transistor such as a metal-oxide-semiconductor field effect transistor (MOSFET). The selector 118 may include a first source/drain region 120 and a second source/drain region 122 disposed in or on the substrate 602 on opposite sides of a gate structure 124. A word line WL may be connected to the gate structure 124. A source line SL may be connected to the first source/drain region 120, and the second source/drain region 122 may be coupled to the memory cell 108 through interconnect metal layers such as interconnect metal layers 606a, 606b. The first source/drain region 120 and the second source/drain region 122 can be, for example, heavily doped semiconductor regions. The gate structure may comprise, for example, polysilicon or a metal material, such as aluminum, tungsten, titanium, or another suitable conductive material separated from the substrate 602 by a dielectric layer that may be or comprise, for example, an oxide, a high-k dielectric material, or another suitable dielectric material. During operation, signals (e.g., voltages and/or currents) may be selectively applied to the word line WL, the source line SL, and the bit line BL to read data from and to write data to the memory cell 108.

In some embodiments, selectors are absent from the reference MTJ array 308. A referencing bias can be applied to the reference MTJ array 308 to measure the gross resistance of the reference cells 108'. As an example, a reference line RL may be connected to the top electrode 114 of one or more reference cells 108' for the communication of the gross resistance. During operation, the referencing bias can be applied between the reference line RL and a lower metal line of the lower interconnect metal layer 606b connected to the bottom electrode 110. It is appreciated that the reference MTJ array 308 can be flipped such that the reference line RL may be connected to the bottom electrode 110 of one or more reference cells 108', and the the referencing bias can be applied between the reference line RL and an upper metal line of the upper interconnect metal layer 606c connected to the top electrode 114. In some embodiments, an initializing bias can be applied to the reference MTJ array 308 to pre-set or reset the reference cells 108'.

FIG. 7 illustrate top views 700a, 700b showing some further device structure examples for the MRAM device 302 as disclosed associated with FIGS. 3-6 above including the main MTJ array 306 and the reference MTJ array 308 according to some embodiments. As shown in the top view 700a and FIG. 5A, in some embodiments, the main MTJ array 306 comprises a plurality of memory units C11-C33 having memory cells 108 in rows and/or columns with any number of memory units. The memory units C11-C33 may be configured by the cross-arranged bit-lines $BL_1$-$BL_3$ and word-lines $WL_1$-$WL_3$. The word-lines $WL_1$-$WL_3$ may be used to control and select from the memory units C11-C33. When a memory cell 108 is selected, a read voltage or a write voltage may be applied to that memory cell.

As shown in the top view 700b and FIG. 5A, in some embodiments, the reference MTJ array 308 comprises a plurality of magnetic reference cells R11-R33. The magnetic reference cells R11-R33 may be arranged within the reference MTJ array 308 in rows and/or columns or in any other suitable patterns. The reference MTJ array 308 may have any number of reference cells 108'. The reference cells 108' of the reference MTJ array 308 may be coupled either in series, in parallel, or the combination thereof. The top view 700b and FIG. 6 show an example of the series connection. The bottom electrodes of a first magnetic reference cell R11 and a second magnetic reference cell R12 may be connected together through a metal line of the lower interconnect metal layer 606b, and top electrodes of the second magnetic reference cell R12 and a third magnetic reference cell R13 may be connected together through a metal line of the upper interconnect metal layer 606c. The remaining magnetic reference cells can also be arranged in similar manners. In some aspects, the reference cells 108' are pre-set to one resistance state and may be flipped to an opposite resistance state subject to the external magnetic field around the MRAM device.

In some embodiments, the reference cells 108' have the same or similar dimensions with the memory cells 108 for the consistency of manufacturing. In some alternative embodiments, the reference cells 108' have lateral dimensions smaller than those of the memory cells 108. In some aspects, a diameter or a lateral dimension of a reference cell 108' of the reference MTJ array 308 is about 70% to 90% of a diameter or a lateral dimension of the memory cells 108 of the main MTJ array 306. In some other aspects, a diameter or a lateral dimension of a reference cell 108' of the reference MTJ array 308 is about 5 nm to 10 nm less of a diameter or a lateral dimension of the memory cells 108 of the main MTJ array 306. For example, the diameter of each of the reference cells 108' of the reference MTJ array 308 may be 15-90 nm, while the diameter of each of the memory cells 108 of the main MTJ array 306 may be 20-100 nm. A smaller MTJ dimension of the reference MTJ array 308 is more susceptible to the external magnetic field and thus can provide more sensitive detection of the external magnetic field. Meanwhile, the MTJ dimension of the reference MTJ array 308 smaller than 70% or 5-10 nm less of the main MTJ array 306 may cause fabrication difficulties in the scaling nodes with small critical dimensions.

In addition, though the memory cell 108 and the reference cell 108' are both shown as having a round circle shape in FIG. 7, they can be various shapes. For example, the memory cell 108 and the reference cell 108' can be other centro-symmetrical shapes such as a square, or other orthopolygons. In some alternative embodiment, the memory cell 108 and/or the reference cell 108' can have an axial symmetrical shape that is longer in a length direction than a width direction, such that an area of the memory cell 108 can be enlarged by arranging a longer length, or an area of the reference cell 108' can be reduced by arranging a shorter width. Examples of the memory cells 108 and/or reference cells 108' include an oval, a rectangular, or other suitable shapes.

Figure 8:
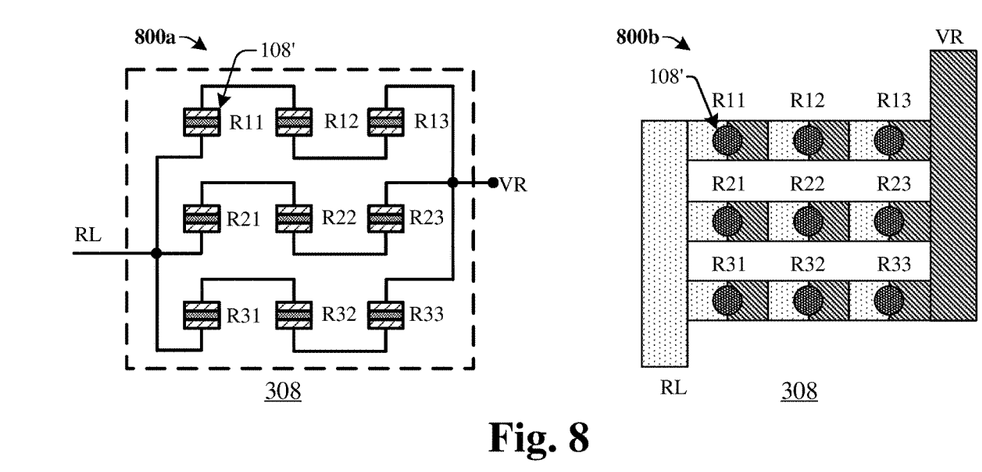
FIG. 8 illustrates some additional device structure examples for a MRAM device in accordance with some additional embodiments.
Figure 9:
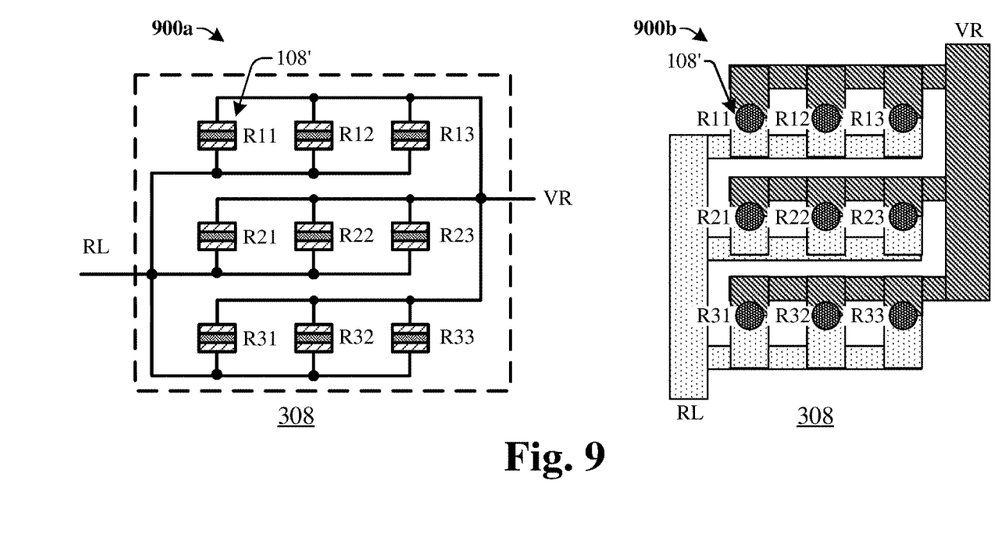
FIG. 9 illustrates some additional device structure examples for a MRAM device in accordance with some further additional embodiments.

FIG. 8 and FIG. 9 show some additional device structure examples for the MRAM device 302 as disclosed associated with FIGS. 3-7 above. As shown by the block diagrams 800a, 900a and the top views 800b, 900b, the reference cells 108' of the reference MTJ array 308 may be coupled either in series, in parallel, or the combination thereof. For example, as shown in the block diagram 800a and the top views 800b, a first group of magnetic reference cells R11, R12, R13, a second group of magnetic reference cells R21, R22, R23, and a third group of magnetic reference cells R31, R32, R33 are respectively connected in series and then connected in parallel one from another to be connected to a reference line RL. As another example shown in the block diagram 900a and the top views 900b, all magnetic reference cells R11-R33 can be connected in parallel and connected to a reference line RL. A biasing voltage VR can be applied to the reference cells 108' during operation to measure a gross resistance of the reference MTJ array 308 and thus indicating a strength of an external magnetic field around the MRAM device 302.

Accordingly, in some embodiments, the present disclosure relates to a method to be implemented by a controller for determining an external magnetic field effect to a magnetoresistive random access memory (MRAM) device operatively associated with the controller. The method comprises reading memory data and error correction redundancy corresponding to the memory data from the MRAM device and determining a bit error rate by executing error correction code (ECC) check based on the memory data and the error correction redundancy, the bit error rate indicating a retention failure rate of the MRAM device. The method further comprises comparing the retention failure rate with a failure rate threshold that is pre-determined and providing a notification signal indicating that the memory data is untrustworthy if the retention failure rate is greater than the failure rate threshold.

In other embodiments, the present disclosure relates to a magnetoresistive random access memory (MRAM) device. The MRAM device includes a main magnetic tunnel junction (MTJ) array comprising a plurality of memory cells configured to store memory data and a reference MTJ array comprising a plurality of reference cells having MTJ structures. The MRAM device further includes a controller operatively associated with the main MTJ array and the reference MTJ array. The controller is configured to receive a gross resistance of the reference MTJ array being related to a strength of an external magnetic field, determine whether the external magnetic field is fatal based on the received gross resistance of the reference MTJ array and a pre-determined threshold, and provide notification indicating that the memory data stored in the main MTJ array is untrustworthy if it is determined that the external magnetic field around the MRAM device is fatal.

In yet other embodiments, the present disclosure relates to a method to be implemented by a controller for determining an external magnetic field surrounding a magnetoresistive random access memory (MRAM) device operatively associated with the controller. The MRAM device includes a magnetic tunnel junction (MTJ) array comprising a plurality of memory cells and a reference MTJ array comprising a plurality of reference cells. The method comprises reading or writing memory data stored in the MTJ array and detecting a referencing MTJ array signal from the reference MTJ array. The method further comprises comparing the referencing MTJ array signal with a pre-determined threshold and providing a notification signal indicating that the memory data is untrustworthy if the referencing MTJ array signal exceeds the pre-determined threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive random access memory (MRAM) device comprising:
 a main magnetic tunnel junction (MTJ) array comprising a plurality of memory cells configured to store memory data;
 a reference MTJ array comprising a plurality of reference cells including a first reference cell and a second reference cell coupled in series and having MTJ structures, wherein the first and second reference cells have a first resistance when the MTJ structures of the first and second reference cells have a first magnetization orientation, wherein the first and second reference cells have a second resistance, greater than the first resistance, when the MTJ structures of the first and second reference cells have a second magnetization orientation different than the first magnetization orientation, and wherein a gross resistance of the reference MTJ array includes a resistance of the first reference cell and a resistance of the second reference cell and is related to a strength of an external magnetic field around the MRAM device; and
 a controller operatively associated with the main MTJ array and the reference MTJ array, wherein the controller is configured to:
 initialize the resistance of the first reference cell and the resistance of the second reference cell to the second resistance to initialize the gross resistance of the reference MTJ array to a third resistance, greater than the second resistance;
 receive the gross resistance of the reference MTJ array;
 determine whether the gross resistance of the reference MTJ array is less than a pre-determined threshold;
 determine that at least a portion of the memory data stored in the main MTJ array is unrepairable in response to determining that the gross resistance of the reference MTJ array is less than the pre-determined threshold; and
 provide notification indicating that the memory data stored in the main MTJ array is untrustworthy in response to determining that at least the portion of the memory data stored in the main MTJ array is unrepairable.

2. The MRAM device of claim 1, wherein the plurality of reference cells of the reference MTJ array respectively has the same composition as the plurality of memory cells of the main MTJ array.

3. The MRAM device of claim 1, wherein the plurality of reference cells of the reference MTJ array respectively has smaller lateral dimensions than the plurality of memory cells of the main MTJ array.

4. The MRAM device of claim 1, wherein the plurality of memory cells of the main MTJ array comprise selectors connected to the MTJ structures, and wherein the reference MTJ array is absent of selectors.

5. The MRAM device of claim 1, wherein the first reference cell and the second reference cell of the reference MTJ array are coupled in series between a first reference line and a second reference line.

6. The MRAM device of claim 5, wherein the reference cells include a third reference cell and a fourth reference cell having MTJ structures, wherein the third reference cell and the fourth reference cell are coupled in series with the first reference cell and the second reference cell between the first reference line and the second reference line.

7. The MRAM device of claim 1, wherein the controller is further configured to:
 detect a change in the gross resistance of the reference MTJ array from the third resistance to a fourth resistance less than the third resistance; and
 determine the strength of the external magnetic field based on the change in the gross resistance of the reference MTJ array from the third resistance to the fourth resistance.

8. The MRAM device of claim 1, wherein the reference cells are more sensitive to the external magnetic field than the plurality of memory cells.

9. A method to be implemented by a controller for determining an external magnetic field surrounding a magnetoresistive random access memory (MRAM) device operatively associated with the controller, the MRAM device including a main magnetic tunnel junction (MTJ) array comprising a plurality of memory cells and a reference MTJ array comprising a plurality of reference cells including a first reference cell and a second reference cell both coupled in parallel between a first reference line and a second reference line, the first and second reference cells having a first resistance when the first and second reference cells have a first magnetization orientation, the first and second reference cells having a second resistance, greater than the first resistance, when the first and second reference cells have a second magnetization orientation, different than the first magnetization orientation, the method comprising:

initializing a resistance of the first reference cell and a resistance of the second reference cell to the first resistance to initialize a net resistance between the first reference line and the second reference line, including both a resistance of the first reference cell and a resistance of the second reference cell, to a third resistance, less than the first resistance;

reading or writing memory data stored in the main MTJ array;

detecting a referencing MTJ array signal from the reference MTJ array, the referencing MTJ array signal indicating the net resistance between the first reference line and the second reference line;

comparing the referencing MTJ array signal with a pre-determined threshold and determining whether the net resistance between the first reference line and the second reference line exceeds the pre-determined threshold; and     providing a notification signal indicating that the memory data stored in the main MTJ array is unrepairable in response to determining that the net resistance between the first reference line and the second reference line exceeds the pre-determined threshold.

10. The method of claim 9, further comprising:

detecting a change in the net resistance between the first reference line and the second reference line from the third resistance to a fourth resistance greater than the third resistance; and     determining a strength of the external magnetic field based on a difference between the third resistance and the fourth resistance.

11. The method of claim 9, wherein the method further comprises applying an initializing bias to the reference MTJ array to reset the plurality of reference cells to the first resistance for a next detection of the external magnetic field in response to determining whether the net resistance between the first reference line and the second reference line exceeds the pre-determined threshold.

12. The method of claim 9, wherein the pre-determined threshold is determined by performing a testing process supplying the external magnetic field with a threshold strength that fatally affects the MRAM device.

13. The method of claim 9, wherein the pre-determined threshold is retrieved from a memory.

14. The method of claim 9, further comprising:

destroying the memory data stored in the main MTJ array in response to the notification signal indicating that the memory data stored in the main MTJ array is unrepairable.

15. A method to be implemented by a controller for determining an effect of an external magnetic field on to a magnetoresistive random access memory (MRAM) device operatively associated with the controller, the external magnetic field originating from a source that is external to the MRAM device, the method comprising:

reading or writing memory data stored in a main MTJ array of the MRAM device;

initializing states of approximately all reference cells of a reference MTJ array of the MRAM device to a first state;

reading a reference signal from the reference MTJ array, the reference signal indicating the states of the reference cells;

detecting a change in the reference signal, the change indicating that the states of a portion of the reference cells flipped from the first state to a second state, different than the first state, in response to the external magnetic field;

determining a strength of the external magnetic field based on the change in the reference signal;

determining whether the strength of the external magnetic field is greater than a threshold strength; and     providing a notification signal indicating that the memory data stored in the main MTJ array is unrepairable in response to determining that the strength of the external magnetic field is greater than the threshold strength.

16. The method of claim 15, wherein the threshold strength is determined by obtaining a pre-stored value from a memory coupled to the controller.

17. The method of claim 15, wherein the reference cells of the reference MTJ array has a lateral dimension about 5 nm to 10 nm smaller than memory cells of the MRAM device.

18. The method of claim 15, wherein the MRAM device and the reference MTJ array are both disposed within an interconnect structure over a substrate.

19. The method of claim 15, further comprising providing a destroy command to protect security data in response to determining that the memory data stored in the MRAM device is determined as untrustworthy, wherein the memory data stored in the MRAM device is erased in response to the destroy command.

20. The method of claim 15, wherein a state of a reference cell of the reference MTJ array is the first state when the reference cell has a first resistance and a first magnetization orientation, and wherein the state of the reference cell of the reference MTJ array is the second state when the reference cell has a second resistance, different than the first resistance, and a second magnetization orientation, different than the first magnetization orientation.

\* \* \* \* \*